US007265582B2

(12) United States Patent
Hsu et al.

(10) Patent No.: US 7,265,582 B2
(45) Date of Patent: Sep. 4, 2007

(54) LEVEL SHIFTER (75) Inventors: Wei-Jen Hsu, Kaohsiung (TW);
Ming-Dou Ker, Hsinchu (TW);
Ying-Hsin Li, Kaohsiung (TW); An Shih, Changhua (TW)

(73) Assignee: TPO Displays Corp., Chu-Nan (TW)

( * ) Notice: Subject to any disclaimer, the term of this patent is extended or adjusted under 35 U.S.C. 154(b) by 208 days.

(21) Appl. No.: 11/004,044

(22) Filed: Dec. 2, 2004

(65) Prior Publication Data
US 2005/0146370 A1 Jul. 7, 2005

(30) Foreign Application Priority Data
Dec. 2, 2003 (TW) .............................. 92133794 A (51) Int. Cl.
H03K 19/094 (2006.01)
H03K 19/0175 (2006.01)
H03K 19/00 (2006.01)
H03K 19/096 (2006.01)

(52) U.S. Cl. ............................ 326/68; 326/80; 326/81; 326/83; 326/93; 326/95; 327/208; 327/209; 327/210; 327/211; 327/213; 327/214; 327/215

(58) Field of Classification Search ................ 326/62, 326/68, 81, 83; 327/333
See application file for complete search history.

(56) References Cited

U.S. PATENT DOCUMENTS 6,002,290 A * 12/1999 Avery et al. ................ 327/333
6,274,070 B1 * 8/2001 Tanigaki et al. ............ 264/104
6,275,070 B1 * 8/2001 Pantelakis et al. ............ 326/98
6,300,796 B1 * 10/2001 Troutman et al. ............. 326/81
6,404,229 B1 * 6/2002 Barnes ........................ 326/68
6,407,579 B1 * 6/2002 Goswick ...................... 326/81
6,414,534 B1 * 7/2002 Wang et al. ................ 327/333
6,414,536 B1 * 7/2002 Chao .......................... 327/540
6,703,863 B2 * 3/2004 Gion .......................... 326/62
6,803,800 B2 * 10/2004 Chen .......................... 327/333

(Continued)

FOREIGN PATENT DOCUMENTS

CN 1402425 3/2003

(Continued)

OTHER PUBLICATIONS

Toshiba America Electronic Components, Inc. Toshiba America Electronic Components Demonstrates First "System on Glass" (SOG) Input Display With Built-In Image Capture Toshiba News Press Release TO-314; May 12, 2003 http://www.toshiba.com/taec/news/press_releases/2003/to-314.jsp.*

*Primary Examiner*—Vibol Tan
*Assistant Examiner*—Dylan White
(74) *Attorney, Agent, or Firm*—Liu & Liu (57) ABSTRACT

A level shifter is provided. The level shifter includes a first input transistor, a second input transistor, a first bias transistor, a second bias transistor, a first switch transistor and a second switch transistor. At the time of change of the signal status, by raising the potential of the body terminal of the first input transistor, the threshold voltage is reduced so that the current flowing through the second input transistor is increased to shorten the time of the change of the signal status.

16 Claims, 7 Drawing Sheets

U.S. PATENT DOCUMENTS

| | | | |
|---|---|---|---|
| 6,864,718 B2 * | 3/2005 | Yu | 326/68 |
| 2003/0174007 A1 * | 9/2003 | Suga | 327/333 |
| 2003/0214506 A1 * | 11/2003 | Koselj et al. | 345/519 |
| 2004/0145583 A1 * | 7/2004 | Morita | 345/211 |

FOREIGN PATENT DOCUMENTS

| | | |
|---|---|---|
| CN | 1433076 | 7/2003 |

* cited by examiner

LEVEL SHIFTER

CROSS-REFERENCE TO RELATED APPLICATION

This application claims the priority benefit of Taiwan application serial no. 92133794, filed on Dec. 2, 2003.

BACKGROUND OF THE INVENTION

1. Field of Invention

This invention generally relates to a level shifter, and more particularly to a level shifter with an active substrate bias to shorten the shifting time.

2. Description of the Related Art

As the semiconductor device and the display technology advances, the consumers can enjoy the new application of the new technology. As to display devices, a cathode ray tube (CRT) had dominated the display market because of its good display quality and low cost. However, CRT cannot provide a good solution for compact size and low power consumption due to its physical limitation. Hence, thin film transistor liquid crystal display (TFT LCD) becomes the main stream because of its advantages of high resolution, compact size, low power consumption and radiation free.

In a TFT LCD, the level shifter is one of the major circuits for the driving circuits; e.g. the scan driver and data driver, of a display panel. The level shifter converts an input signal with a low voltage level to an output signal with a high voltage level. Currently, TFT LCD usually uses low-temperature polysilicon (LTPS) TFT, which has a higher threshold voltage and a lower mobility than the CMOS. Hence, as the number of the pixels increases, the operational speed will correspondingly decrease when the LTPS TFT is used.

Figure 5:
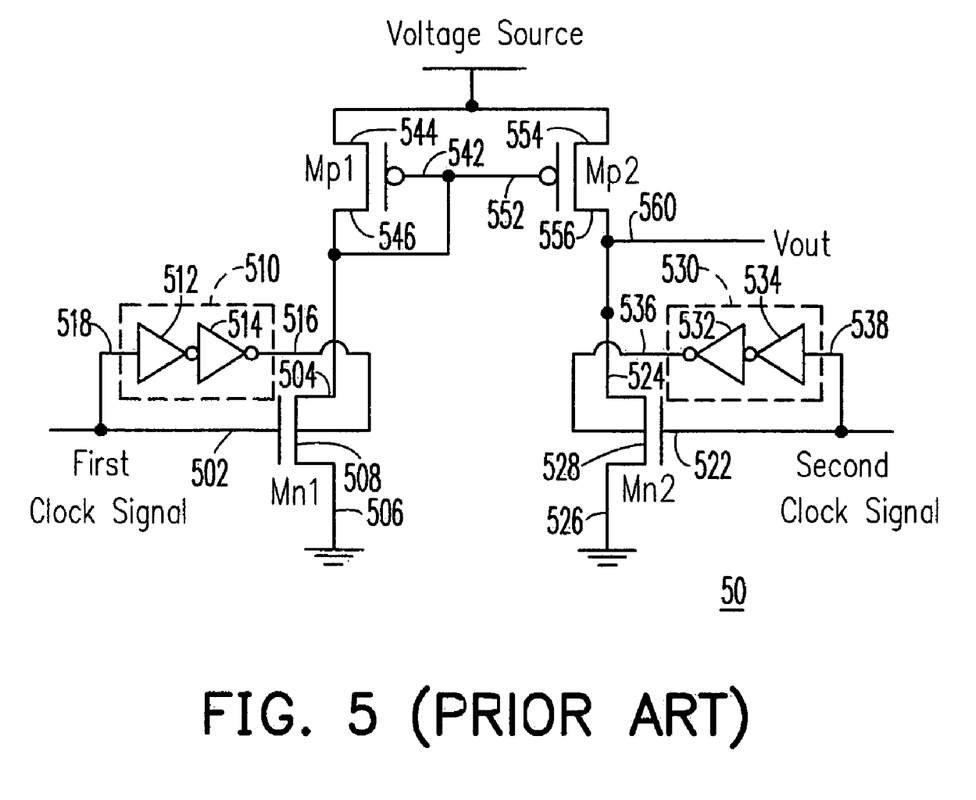
FIG. 5 is a schematic circuit diagram of a conventional level shifter.

FIG. 5 is a circuit of the conventional level shifter, which is generally disposed with the scan driver and the data driver of a display panel, featured to convert an input signal with a low voltage level to an output signal with a high voltage level. Referring to FIG. 5, the level shifter 50 includes a first input transistor Mn1, a first substrate bias circuit 510, a first switch transistor Mp1, a second input transistor Mn2, a second substrate bias circuit 530, and a second switch transistor Mp2. The gate 502 of the first input transistor Mn1 is coupled to the signal source of the first clock signal; the source 506 is grounded. The output terminal 516 of the first substrate bias circuit 510 is coupled to the substrate 508 of the first input transistor Mn1; the input terminal 518 of the first substrate bias circuit 510 is coupled to the gate 502 of the first input transistor Mn1. The drain 524 of the second input transistor Mn2 is coupled to the output terminal 560 wherefrom an output signal $V_{out}$ is read; the gate 522 is coupled to the signal source of the second clock signal; the source 526 is grounded. The output terminal 536 of the second substrate bias circuit 530 is coupled to the substrate 528 of the second input transistor Mn2; the output terminal 536 is coupled to the gate 522 of the second input transistor Mn2. The drain 544 of the first switch transistor Mp1 is coupled to the voltage source; the gate 542 and the source 546 is coupled to the drain 504 of the first input transistor Mn1. The drain 554 of the second switch transistor Mp2 is coupled to the voltage source; the gate 552 is coupled to the gate 542 of the first switch transistor Mp1; and the source 556 is coupled to the drain 524 of the second input transistor Mn2.

The first substrate bias circuit 510 and the second substrate bias circuit 530 include inverting buffers 512 and 514, and inverting buffers 532 and 534, respectively.

The conventional level shifter operates as follows. When the first clock signal is at logic high and the second clock signal is at logic low, the first input transistor Mn1, the first switch transistor Mp1, and the second switch transistor Mp2 will be turned on, and the second input transistor Mn2 will be turned off. When the first clock signal is changed to be at logic low and the second clock signal is changed to be at logic high, the first input transistor Mn1, the first switch transistor Mp1, and the second switch transistor Mp2 will be turned off. At the same time, the second substrate bias circuit 530 applies a high voltage on the substrate 528 of the second input transistor Mn2 to suppress the threshold voltage of the second input transistor Mn2 and to increase the operational speed of the level shifter 50. However, because the conventional level shifter 50 includes the first and second substrate bias circuits 510 and 530 that takes up additional space, the size of the conventional level shifter 50 is larger than desired. Usually in an LTPS TFT-LCD panel, pixels along with peripheral driving circuits are integrated on a glass substrate, featuring System On Glass (SOG). Therefore, it is desirable to design smaller area of the driving circuit such that display area is increased and fabrication cost is lowered.

SUMMARY OF THE INVENTION

The present invention overcomes the drawbacks in the prior art by providing a level shifter that raises the potential of the substrate of the input transistor, to reduce the threshold voltage so that the current flowing through the input transistor is increased to shorten the time of the change of the signal status.

In one aspect of the present invention, the novel level shifter comprises a switch circuit and an input transistor module that is operatively coupled to a first output terminal of the switch circuit. The input transistor module includes a bias transistor and an input transistor. The source of the bias transistor is operatively coupled to the substrate of the input transistor. A grounding module is operatively coupled to a second output terminal of the switch module. The grounding module is structured to ground the second output terminal of the switch circuit in accordance with a clock signal. The grounding module may include a bias transistor and an input transistor, wherein the source of the bias transistor is operatively coupled to the substrate of the input transistor. The grounding module may be configured with a structure that mirrors the input transistor module.

The bias transistor in the input transistor module may include N type or P type transistors. Depending on the type of transistors, the gate of the bias transistor may be cross-connected with the second output of the switch circuit or with the clock signal for the grounding module.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE EMBODIMENTS

Figure 1A:
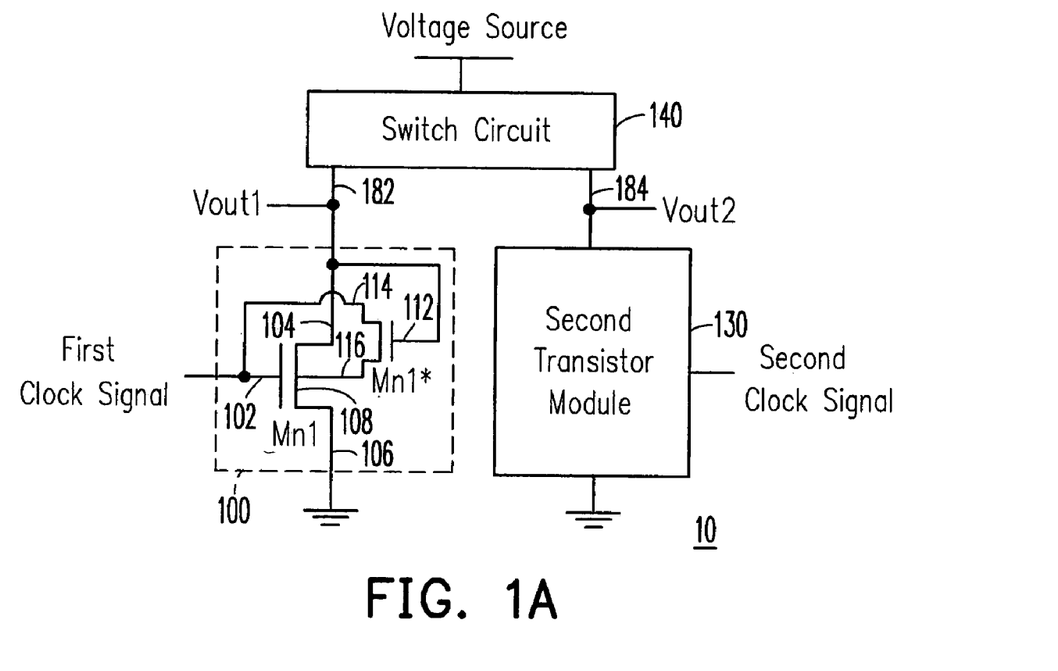
FIG. 1A is a schematic circuit diagram illustrating a gate-drain-connected level shifter in accordance with one embodiment of the present invention.

FIG. 1A is a circuit diagram of a gate-drain-connected level shifter in accordance with one embodiment of the present invention. In FIG. 1A, the level shifter 10 is coupled to the voltage source and the signal sources of the first clock signal and the second clock signal. The level shifter 10 includes a first transistor module 100, a grounding module, which may be a second transistor module 130 and a switch circuit 140.

In this embodiment, the switch circuit 140 has a first output terminal 182 and a second output terminal 184. The switch circuit 140 receives the voltage source and periodically upon a clock signal of the display system provides power to the first output terminal 182 and the second output terminal 184.

In this embodiment, the first transistor module 100 includes a first input transistor Mn1 and a first bias transistor Mn1*. The first input transistor Mn1 has a drain 104, a source 106, a gate 102 and a substrate 108. The drain 104 of the first input transistor Mn1 is coupled to a first output terminal 182. The source 106 of the first input transistor Mn1 is grounded. The gate 102 of the first input transistor Mn1 receives the first clock signal and determines whether to turn on the first input transistor Mn1 based on the first clock signal. The first bias transistor Mn1* has a drain 114, a source 116 and a gate 112. The drain 114 of the first bias transistor Mn1* is coupled to the gate 102 of the first input transistor Mn1. The source 116 of the first bias transistor Mn1* is coupled to the substrate 108 such that the bias raises potential of the substrate of the first input transistor Mn1, the gate 112 of the first bias transistor Mn1* is coupled to the drain 104 of the first input transistor Mn1 to determine whether to turn on the first bias transistor Mn1* based on the first output signal of the first output terminal. In this embodiment, both the first input transistor Mn1 and the first bias transistor Mn1* are NMOS transistors.

In this embodiment, one terminal of the second transistor module 130 is coupled to the second output terminal 184, and the other terminal is grounded. The second transistor module 130 determines whether to ground the second output terminal 184 based on the second clock signal.

Figure 1B:
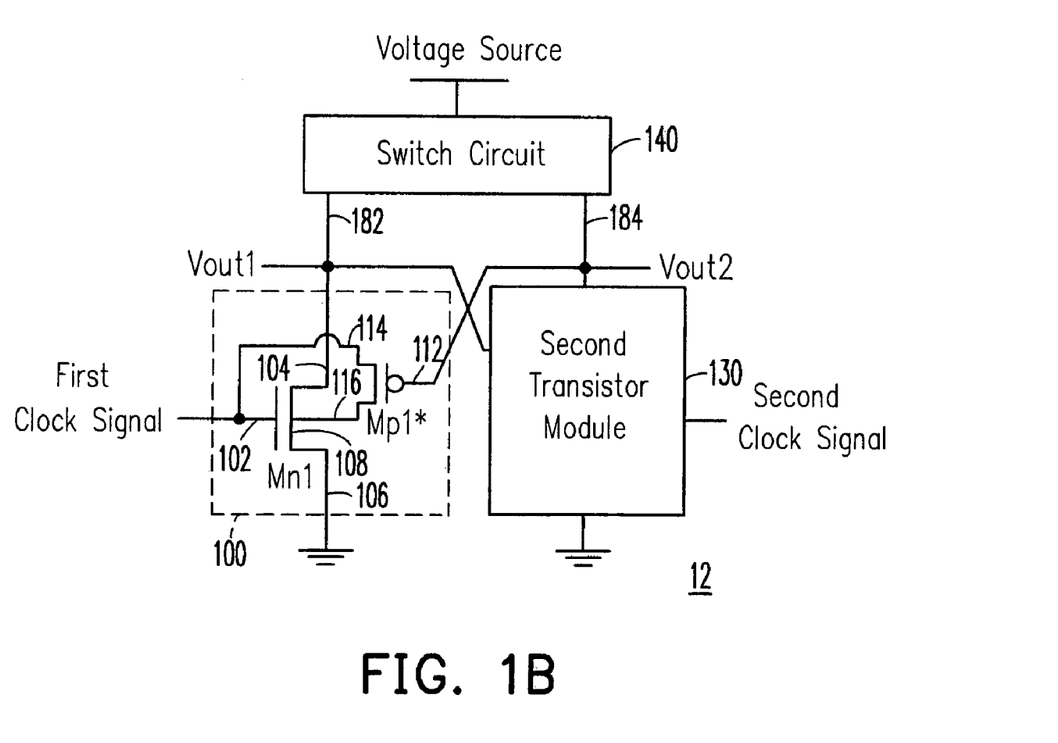
FIG. 1B is a schematic circuit diagram illustrating a gate-drain-connected level shifter in accordance with one embodiment of the present invention.

Referring to FIG. 1B, a circuit diagram of a gate-drain connected level shifter is illustrated in accordance with one embodiment of the present invention. In FIG. 1B, the first bias transistor is replaced with a PMOS transistor Mp1* as differed from FIG. 1A, and the gate 112 of the first bias transistor Mp1* is coupled to the second output terminal 184 for determining whether to be turned on according to the signal thereof.

Figure 2A:
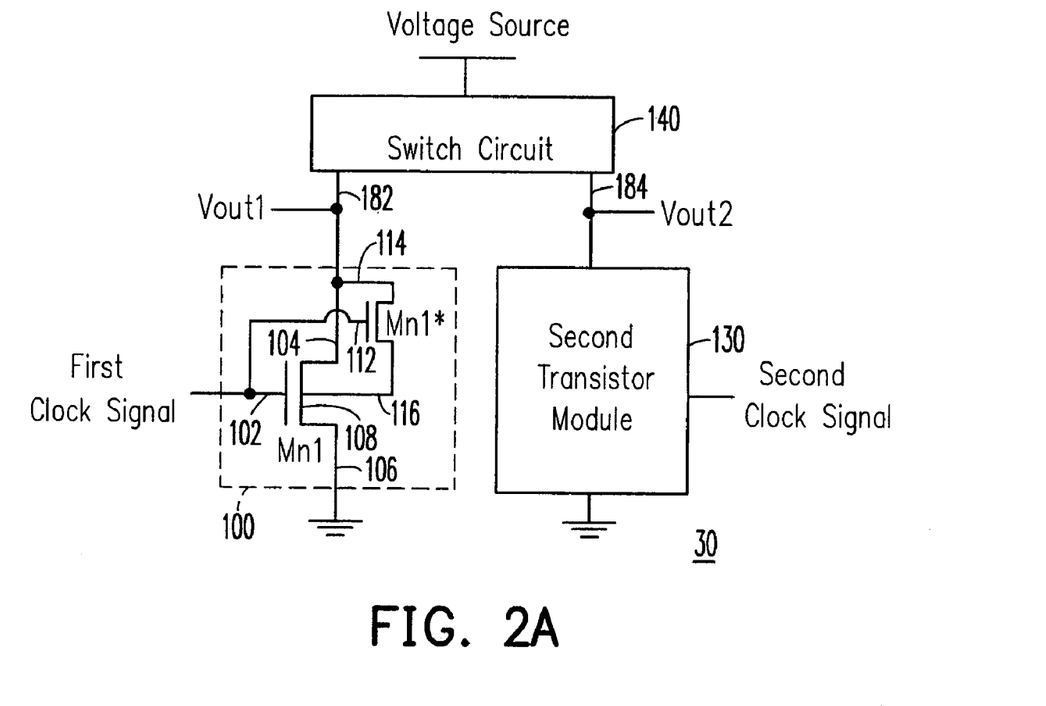
FIG. 2A is a schematic circuit diagram illustrating a common-gate level shifter in accordance with one embodiment of the present invention.

Referring to FIG. 2A, a circuit diagram of a common-gate level shifter is illustrated in accordance with one embodiment of the present invention. Wherein the connection between the first input transistor Mn1 and the first bias transistor Mn1* of the first transistor module 100 is differed from that of FIG. 1A. As in FIG. 1A, the first input transistor Mn1 and the first bias transistor Mn1* are NMOS type transistors.

In this embodiment of the present invention, the first transistor module 100 includes a first input transistor Mn1 and a first bias transistor Mn1*. The first input transistor Mn1 has a drain 104, a source 106, a gate 102 and a substrate 108. The drain 104 of the first input transistor Mn1 is coupled to the first output terminal 182, the source 106 of the first input transistor Mn1 is grounded, and the gate 102 receives the first clock signal for determining whether to turn on the first input transistor Mn1. The first bias transistor Mn1* has a drain 114, a source 116 and a gate 112. The drain 114 of the first bias transistor Mn1* is coupled to the drain 104 of the first input transistor Mn1, the source 116 is coupled to the substrate 108 of the first input transistor Mn1 such that the bias raises potential of the substrate 108, and the gate 112 is coupled to the gate 102 of the first input transistor Mn1 for determining whether to turn on the first bias transistor according to the first clock signal.

Figure 2B:
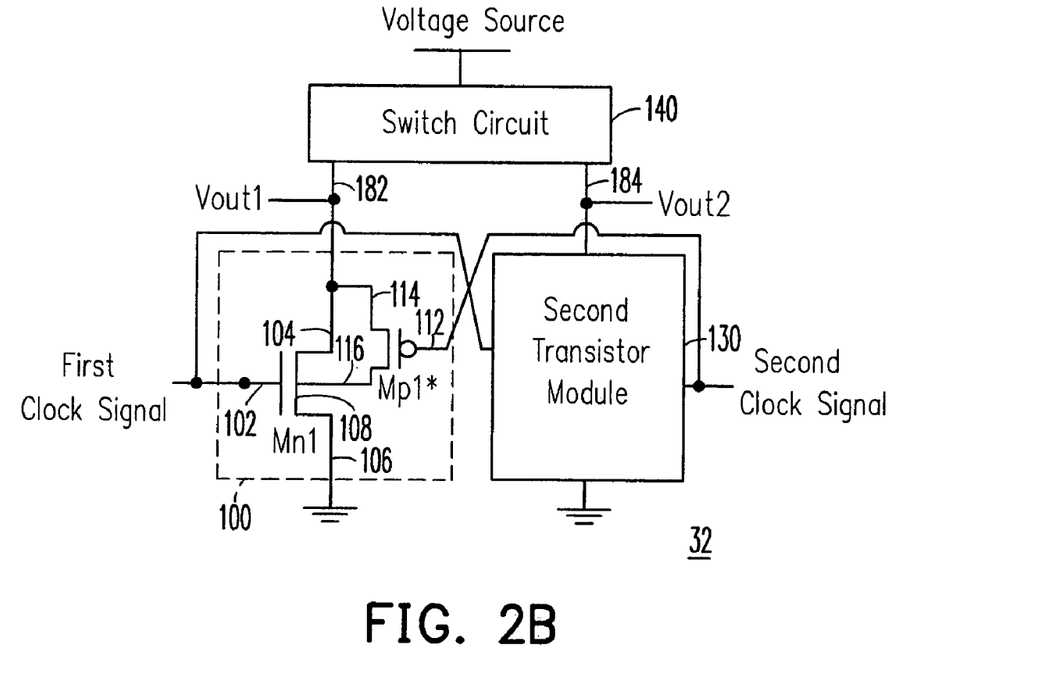
FIG. 2B is a schematic circuit diagram illustrating a common-gate level shifter in accordance with one embodiment of the present invention.

Referring to FIG. 2B, a circuit diagram of another common-gate level shifter according to one embodiment of the present invention is illustrated. In FIG. 2B, the first bias transistor is replaced with a PMOS transistor Mp1* as differed to the FIG. 2A, and the gate 112 of the first bias transistor Mp1* is coupled to the second output terminal 184 for determining whether to be turned on.

Referring to FIGS. 3A to 3D, circuit diagrams of four variations of the second transistor module 130 are illustrated respectively according to embodiments of the present invention.

In the embodiments of the present invention, the second transistor module 130 is not limited to what are demonstrated in the figures. The substrate-bias circuit mentioned in prior art may be implemented in combination with the first transistor module 100.

Figure 3A:
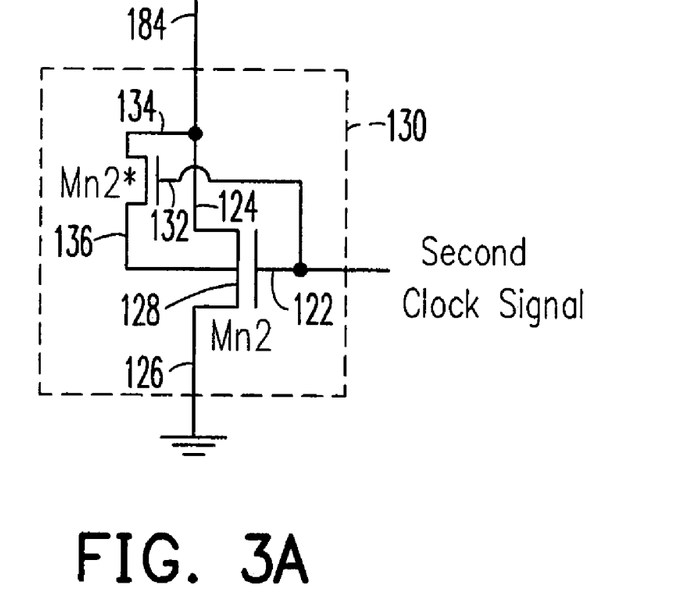
FIG. 3A is a schematic circuit diagram illustrating a second transistor module in accordance with one embodiment of the present invention.

Referring to FIG. 3A, the first variation of the second transistor module 130 is illustrated therein, including a second input transistor Mn2 and a second bias transistor Mn2*. The second input transistor Mn2 has a drain 124, a source 126, a gate 122 and a substrate 128. The drain 124 of the second input transistor Mn2 is coupled to a second output terminal 184. The source 126 of the second input transistor Mn2 is grounded. The gate 122 of the second input transistor Mn2 receives the second clock signal and determines whether to turn on the second input transistor Mn2 based on the second clock signal. The second bias transistor Mn2* has a drain 134, a source 136, and a gate 132. The drain 134 of the second bias transistor Mn2* is coupled to the drain 124 of the second input transistor Mn2. The source 136 of the second bias transistor Mn2* is coupled to the substrate 128 of the second input transistor Mn2 such that bias raises potential of the substrate 128. The gate 132 of the second bias transistor Mn2* is coupled to the gate 122 of the second input transistor Mn2.

Figure 3B:
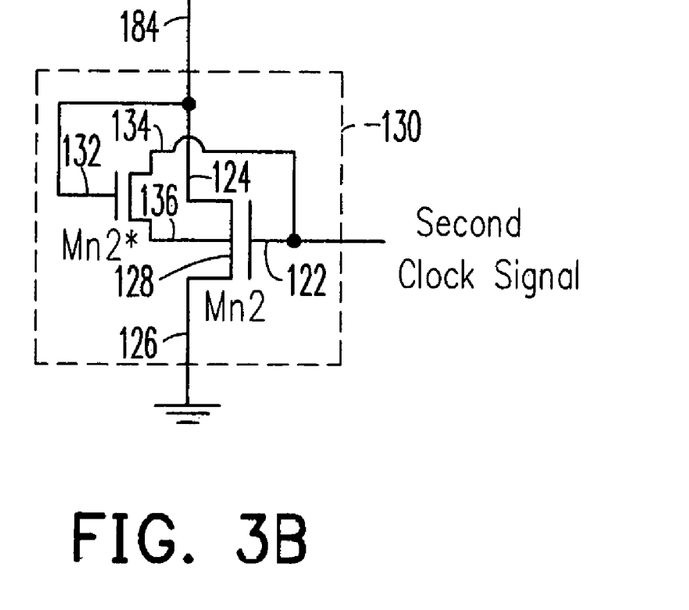
FIG. 3B is a schematic circuit diagram illustrating a second transistor module in accordance with one embodiment of the present invention.

Referring to FIG. 3B, a second variation of the second transistor module 130 is illustrated therein, including a second input transistor Mn2 and a second bias transistor Mn2*. The second input transistor Mn2 has a drain 124, a source 126, a gate 122 and a substrate 128. The drain 124 of the second input transistor Mn2 is coupled to the second output terminal 184, the source 126 of the second input transistor Mn2 is grounded, and the gate 122 of the second input transistor Mn2 receives the second clock signal. The second bias transistor Mn2* has a drain 134, a source 136 and a gate 132. The drain 134 of the second bias transistor Mn2* is coupled to the gate 122 of the second input transistor Mn2, the source 136 of the second bias transistor Mn2* is coupled to the substrate 128 of the second input transistor Mn2 such that the bias raises potential of the substrate 128, and the gate 132 of the second bias transistor Mn2* is coupled to the drain 124 of the second input transistor Mn2.

Figure 3C:
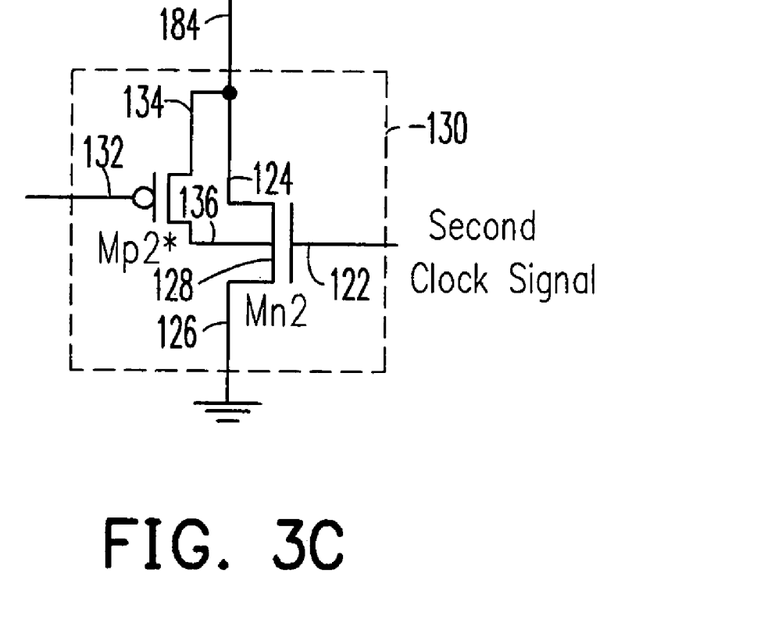
FIG. 3C is a schematic circuit diagram illustrating a second transistor module in accordance with one embodiment of the present invention.

Referring to FIG. 3C, a third variation of the second transistor module 130 is illustrated therein, including a second input transistor Mn2 and a second bias transistor Mp2*. The second input transistor Mn2 has a drain 124, a source 126, a gate 122 and a substrate 128. The drain 124 of the second input transistor Mn2 is coupled to the second output terminal 184, the source 126 of the second input transistor Mn2 is grounded, and the gate 122 of the second input transistor Mn2 receives the second clock signal. The second bias transistor Mp2* has a drain 134, a source 136 and gate 132. The drain 134 of the second bias transistor Mp2* is coupled to the drain 124 of the second input transistor Mn2, the source 136 of the second bias transistor Mp2* is coupled to the substrate 128 of the second input transistor Mn2 such that the bias raises potential of the substrate 128, and the gate 132 of the second bias transistor Mp2* is coupled to the first output terminal 182 or the gate 102 of the first input transistor Mn1.

Figure 3D:
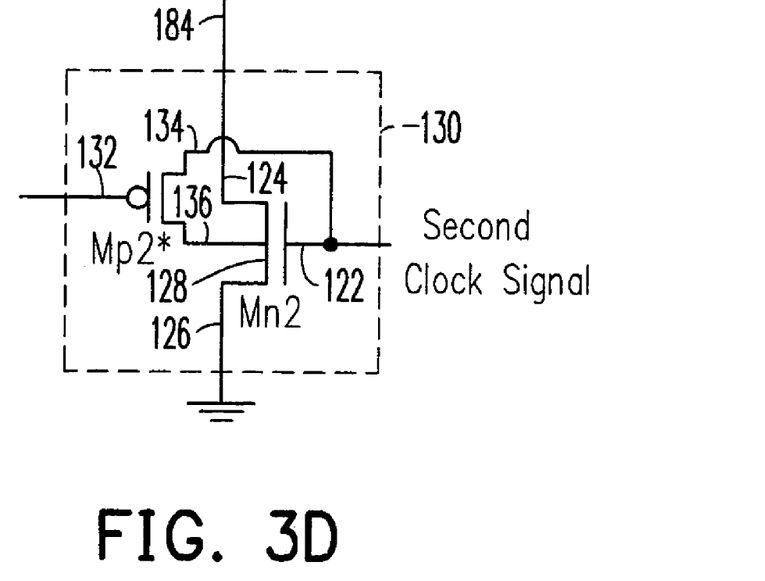
FIG. 3D is a schematic circuit diagram illustrating a second transistor module in accordance with one embodiment of the present invention.

Referring to FIG. 3D, a fourth variation of the second transistor module 130 is illustrated therein, including a second input transistor Mn2 and a second bias transistor Mp2*. The second input transistor Mn2 has a drain 124, a source 126, a gate 122 and a substrate 128. The drain 124 of the second input transistor Mn2 is coupled to the second output terminal 184, the source 126 of the second input transistor Mn2 is grounded, and the gate 122 of the second input transistor Mn2 receives the second clock signal. The second bias transistor Mp2* has a drain 134, a source 136 and a gate 132. The drain 134 of the second bias transistor Mp2* is coupled to the gate 122 of the second input transistor Mn2, the source 136 of the second bias transistor Mp2* is coupled to the substrate 128 of the second input transistor Mn2 such that the bias raises potential of the substrate 128, and the gate 132 of the second bias transistor Mp2* is coupled to the first output terminal 182 or the gate 102 of the first input transistor Mn1.

Figure 4A:
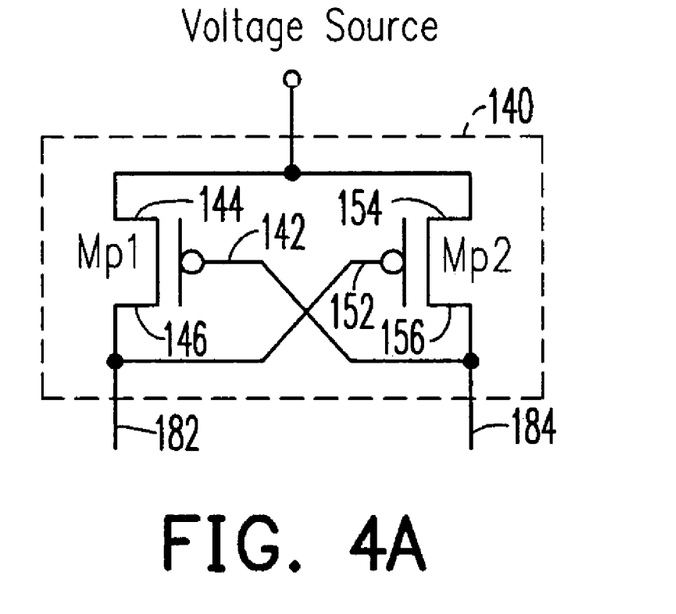
FIG. 4A is a schematic circuit diagram illustrating a switch circuit in accordance with one embodiment of the present invention.

Referring to FIG. 4A, a circuit diagram of a switch diagram is illustrated according to one embodiment of the present invention. The first switch transistor Mp1 has a drain 144, a source 146 and a gate 142. The drain 144 of the first switch transistor Mp1 is coupled to the voltage source, the source 146 of the first switch transistor Mp1 is coupled to the first output terminal 184, and the gate 142 of the first switch transistor Mp1 is coupled to the second output terminal 184. The second switch transistor Mp2 has a drain 154, a source 156 and a gate 152. The drain 154 of the second switch transistor Mp2 is coupled to the voltage source, the source 156 of the second switch transistor Mp2 is coupled to the second output terminal 184, and the gate 152 of the second switch transistor Mp2 is coupled to the first output terminal 182.

Figure 4B:
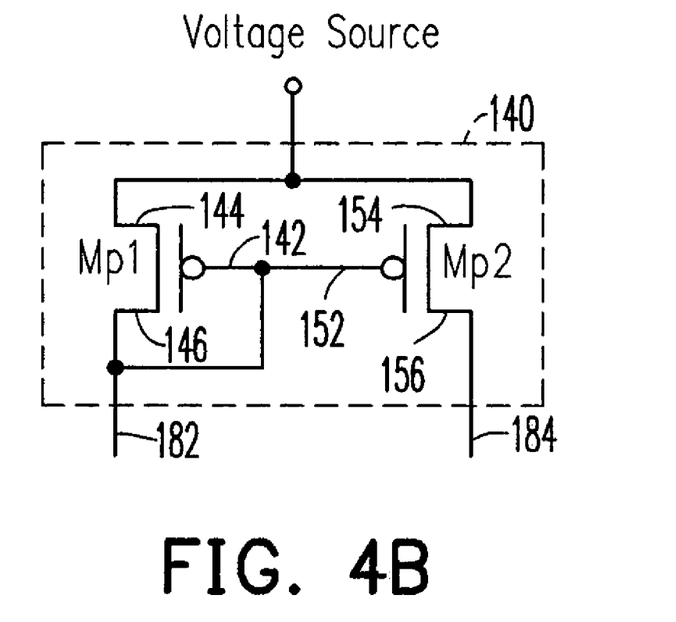
FIG. 4B is a schematic circuit diagram illustrating a switch circuit in accordance with one embodiment of the present invention.

Referring to FIG. 4B, a circuit diagram of another switch circuit is illustrated according to one embodiment of the present invention. In this embodiment, the switch circuit 140 includes a first switch transistor Mp1 and a second switch transistor Mp2. Wherein the first switch transistor Mp1 has a drain 144, a source 146 and a gate 142. The drain 144 of the first switch transistor Mp1 is coupled to a voltage source, the source 146 and the gate 142 of the first switch transistor Mp1 are coupled to the first output terminal 182. The second switch transistor Mp2 has a drain 154, a source 156 and a gate 152. The drain 154 of the second switch transistor Mp2 is coupled to the voltage source, the source 156 of the second switch transistor Mp2 is coupled to the second output terminal 184, and the gate 152 of the second switch transistor Mp2 is coupled to the gate 142 of the first switch transistor Mp1.

The switch circuits 140 shown in FIG. 4A and FIG. 4B are interchangeable; each is applicable in any one of the level shifter circuits shown in FIGS. 1A, 1B, 2A and 2B.

Figure 6A:
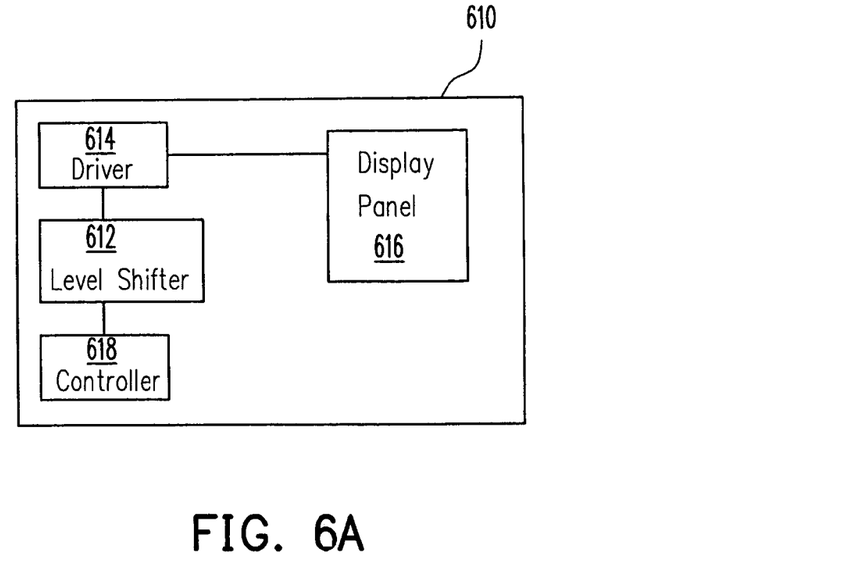
FIG. 6A is a schematic block diagram illustrating a conventional LCD panel featured a level shifter with the scan driver and the data driver thereof according to one embodiment of the present invention.

Referring to FIG. 6A, it illustrates a display device 610, e.g. an LCD panel, comprising a driver 614 featured with a level shifter 612 according to one embodiment of the present invention. The driver 614 of the display device 610 drives a display panel 616 therein, having a plurality of pixels arranged in an array for displaying images, for example. A controller 618 may be disposed with the display device for further controlling purpose. The display panel is then driven for display. The level shifter 612 in FIG. 6A may be implemented according to one selected from the level shifters mentioned above in the foregoing embodiments of the present invention, which is not repeatedly described herein.

Figure 6B:
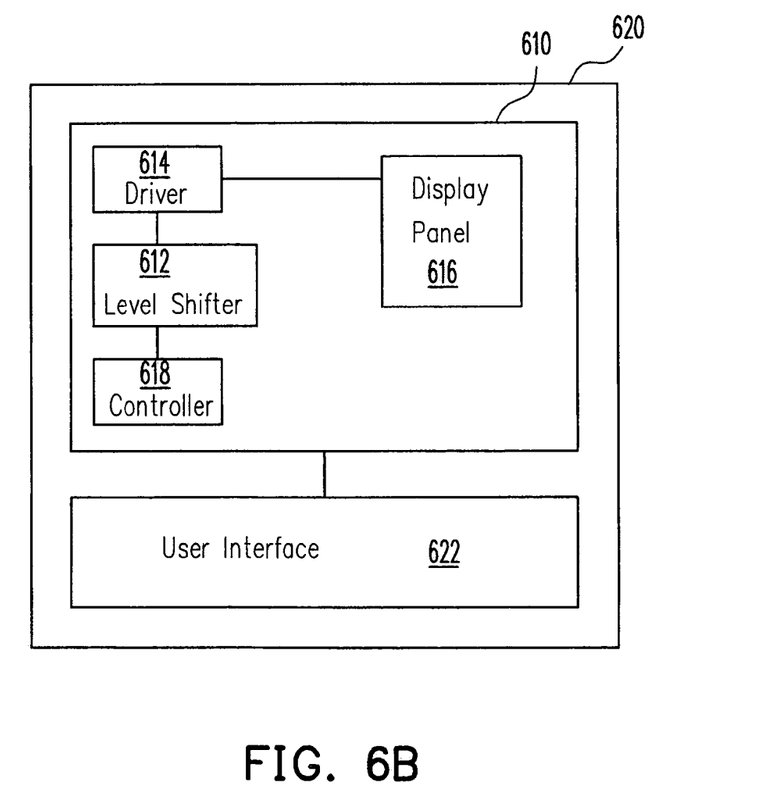
FIG. 6B is a schematic block diagram illustrating an electronic device having a LCD display featured with a level shifter according to one embodiment of the present invention.

Referring to FIG. 6B, it illustrates an electronic device 620, such as a PDA, mobile phone, or any device with information display, comprising a display device 610 as shown in FIG. 6A and a user interface 622 being coupled. For example, when a user is, using the electronic device 620, the user interface 622 allows the user to input the operation signals. Then, the related display information is fed to the display panel 616 for display.

Referring to FIG. 1A again herein. When the second transistor module is set up as the second transistor module 130 as shown in FIG. 3B, the level shifter 10 operates according as follows. When the first clock signal is logic high and the second clock signal is logic low, the first input transistor Mn1 is turned on, the second input transistor Mn2 is not turned on; thus the first bias transistor Mn1* is not turned on, and the second input transistor Mn2 is turned on. Where the substrate 108 of the first input transistor Mn1 is floated, and the substrate 128 of the second input transistor Mn2 is logic low.

When the signal status changes, i.e., when the first clock signal changes its logic potential from logic high to logic low and the second clock signal changes its logic potential from logic low to logic high, the second input transistor Mn2 and the second bias transistor Mn2* are turned on and thus the potential of the substrate 128 of the second input transistor Mn2 will be raised. In the meantime, the second input transistor Mn2 possesses a lower threshold voltage and the current flowing through the second input transistor Mn2 will be increased to shorten time of the change of the signal status.

When the change of the signal status is completed, the signal of the second output terminal 184 becomes logic low and the second bias transistor Mn2* is weak on. The potential of the substrate 128 of the second input transistor Mn2 will be reduced. When the potential of the second output signal is about 0V, the second bias transistor Mn2* is not on and the substrate 128 of the second input transistor Mn2 is floated.

In this embodiment, if the level shifter 12 in FIG. 1B works with the second transistor module 130 in FIG. 3D, the gate 132 of the second bias transistor Mp2* is coupled to the first output terminal 182. The level shifter then performs as follows.

When the first clock signal is at logic high and the second clock signal is at logic low, the first input transistor Mn1 is turned on and the second input transistor Mn2 is not turned on. Hence the first bias transistor Mp1* is not turned on and the second bias transistor Mp2* is turned on. In the meantime, the substrate 108 of the first input transistor Mn1 is floated and the substrate 128 of the second input transistor Mn2 is at logic low.

When the signal status changes, i.e., when the first clock signal changes its logic potential from logic high to logic low and the second clock signal changes its logic potential from logic low to logic high, the second input transistor Mn2 and the second bias transistor Mp2* are turned on and thus the potential of the substrate 128 of the second input transistor Mn2 will be raised. In the meantime, the second input transistor Mn2 has a lower threshold voltage and the current flowing through the second input transistor Mn2 will be increased to shorten time of the change of the signal status.

In this embodiment, as the first input transistor is being turned off, the first output signal approaches to at logic high level and the second bias transistor Mp2* is weak on. The potential of the substrate 128 of the second input transistor Mn2 will be reduced. When the potential of the second output signal is about 0V, the second bias transistor Mp2* is not on and the substrate 128 of the second input transistor Mn2 is floated.

When the level shifter 30 in FIG. 2A works with the second transistor module 130 in FIG. 3A, the level shifter is operated as follows. When the first clock signal is logic high and the second clock signal is logic low, the first input transistor Mn1 and the first bias transistor Mn1* are turned on, the second input transistor Mn2 and the second bias transistor Mn2* are not turned on. Hence the signal of the first output terminal 182 is logic low, and the signal of the second output terminal 184 is logic high. In the meantime, the substrate 108 of the first transistor Mn1 is logic low, and the substrate 128 of the second input transistor Mn2 is floated.

When the signals change their statuses, i.e. the first clock signal changes from logic high to logic low and the second clock signal changes from logic low to logic high, the second input transistor Mn2 and the second bias transistor Mn2* are turned on. Whereas the signal of the second output terminal 184 is still logic high, thus the potential of the substrate 128 of the second input transistor Mn2 is increased. In the meantime, the second input transistor Mn2 possesses lower threshold voltage, thus current flowing through the second input transistor Mn2 is increased up to when the signal of the second output terminal 184 reaches logic low, so that change time of the signals is reduced.

If the level shifter 32 in FIG. 2B works with the second transistor module 130 in FIG. 3C, the gate 132 of the second bias transistor Mp2* receives the first clock signal, and the level shifter 32 is operated as follows. When the first clock signal is logic high and the second clock signal is logic low, the first input transistor Mn1 and the first bias transistor Mp1* are turned on, the second input transistor Mn2 and the second bias transistor Mp2* are not turned on. Hence the signal of the first output terminal 182 is logic low, and the signal of the second output terminal 184 is logic high. Where the substrate 108 of the first input transistor Mn1 is logic low and the substrate 128 of the second transistor Mn2 is floated.

When the signals change, i.e. when the first clock signal changes from logic high to logic low and the second clock signal changes from logic low to logic high, the second input transistor Mn2 and the second bias transistor Mp2* are turned on. Therefore, the signal of the substrate 128 of the second input transistor Mn2 is still logic high. In the meantime, the second input transistor Mn2 possesses lower threshold voltage. And the current flowing through the second input transistor Mn2 is increased up to when the signal of the second output terminal 184 reaches logic low, and the signal change time is thus reduced.

The structure of the second transistor module may be the mirror of the structure of the first transistor module. In the embodiments of the present invention, circuits in FIGS. 1A, 1B, 2A and 2B work with any of the second transistor module 130 in FIGS. 3A~3D respectively. The level shifter is operated similarly to the operations mentioned above. For those skilled in the art, it is understood that variations of circuit operation based on the aforementioned connections are within the scope of the present invention.

In the embodiments of the present invention, when the first bias transistor Mp1* is PMOS transistor, the gate 112 can be instead coupled to the first output terminal 182 in FIG. 1B, similar to the connection in FIG. 1A. When the first bias transistor Mn1* is NMOS transistor, the gate 112 can be instead coupled to the first clock signal in FIG. 2B, similar to the connection in FIG. 2A.

In the embodiments of the present invention, combinations of the first transistor module 100, the second transistor module 130 and the switch circuit 140 are not limited to those mentioned above.

In light of the above, the level shifter of the present invention can simplify the circuit and reduce the threshold voltage. Hence the level shifter of the present invention can make the operational speed fast at the time of the change of the signal status without affecting the function of the circuit.

Although the invention has been described with reference to a particular embodiment thereof, it will be apparent to those skilled in the art that modifications to the described embodiment may be made without departing from the spirit of the invention. Accordingly, the scope of the invention will be defined by the attached claims and not by the above detailed description.

What is claimed is:

1. A level shifter operatively coupled to a first clock signal, a second clock signal and an input voltage, comprising:

a switch circuit receiving the input voltage and having a first output terminal and a second output terminal;

a first input transistor module operatively coupled to the first output terminal of the switch circuit, wherein the first input transistor module comprises a first input transistor, wherein the first input transistor comprises a first substrate, and wherein the first input transistor is switched by the first clock signal, and is biased to lower the threshold voltage of the first input transistor and to raise potential of the first substrate, wherein the first input transistor module further comprises a first bias transistor that comprises an P-type transistor having a gate and a drain, wherein one of the gate or the drain of the first bias transistor is operatively coupled to one of the first output terminal or the second output terminal of the switch circuit and the other one of the gate or the drain of the first bias transistor is operatively coupled to one of the second clock signal or the first clock signal; and a grounding module operatively coupled to the second output terminal of the switch circuit, wherein the grounding module is structured to ground the second output terminal of the switch circuit in accordance with the second clock signal.

2. The level shifter as recited in claim 1, wherein the first bias transistor having a first source that is operatively coupled to the first substrate of the first input transistor.

3. The level shifter as recited in claim 1, wherein the first bias transistor comprises an N-type transistor having a gate and a drain, wherein one of the drain and the gate of the first bias transistor is operatively coupled to the first output terminal of the switch circuit and the other one of the drain or the gate of the first bias transistor is operatively coupled to the first clock signal.

4. The level shifter as recited in claim 1, wherein the grounding module comprises a second input transistor module that comprises a second bias transistor and a second input transistor operatively coupled in a structure that mirrors that of the first input transistor module.

5. The level shifter as recited in claim 4, wherein the second bias transistor in the second input transistor module comprises one of N-type and P-type transistor.

6. The level shifter as recited in claim 5, wherein the second bias transistor comprises an N-type transistor having a gate and a drain, wherein one of the drain and the gate of the second bias transistor is operatively coupled to the second output terminal of the switch circuit and the other one of the drain or the gate of the second bias transistor is operatively coupled to the second clock signal.

7. The level shifter as recited in claim 3, wherein the grounding module comprises a second input transistor module that comprises a second bias transistor and a second input transistor operatively coupled in a structure that mirrors that of the first input transistor module, and wherein the second bias transistor comprises an N-type transistor having a gate and a drain, wherein one of the drain and the gate of the second bias transistor is operatively coupled to the second output terminal of the switch circuit and the other one of the drain or the gate of the second bias transistor is operatively coupled to the second clock signal.

8. The level shifter as recited in claim 1, wherein the grounding module comprises a second input transistor module that comprises a second bias transistor and a second input transistor operatively coupled in a structure that mirrors that of the first input transistor module, and wherein the second bias transistor comprises an P-type transistor having a gate and a drain, wherein one of the gate or the drain of the second bias transistor is operatively coupled to one of the first output terminal or the second output terminal of the switch circuit and the other one of the gate or the drain of the second bias transistor is operatively coupled to one of the second clock signal or the first clock signal.

9. A display device comprising:
a driver circuit comprising a level shifter as in claim 1;
a control circuit operative coupled to the driver circuit; and
a display element operatively coupled to the control circuit, the control circuit controlling the operation of the display element.

10. An electronic device, comprising:
a display device, as in claim 9; and
a controller operatively coupled to the display device, controlling the operations of the display device to render a display image through the display element in accordance with display data.

11. The electronic device as recited in claim 10, wherein the pixels are switched correspondingly by a plurality of LTPS transistors, wherein the LTPS transistors and the level shifter are formed in an SOG configuration.

12. A level shifter operatively coupled to a first clock signal, a second clock signal and an input voltage, comprising:

a switch circuit receiving the input voltage and having a first output terminal and a second output terminal;

a first input transistor module operatively coupled to the first output terminal of the switch circuit, wherein the first input transistor module comprises a first input transistor, wherein the first input transistor comprises a first substrate, and wherein the first input transistor is switched by the first clock signal, and is biased to lower the threshold voltage of the first input transistor and to raise potential of the first substrate; and a grounding module operatively coupled to the second output terminal of the switch circuit, wherein the grounding module is structured to ground the second output terminal of the switch circuit in accordance with the second clock signal, wherein the grounding module comprises a second bias transistor that comprises an P-type transistor having a gate and a drain, wherein one of the gate or the drain of the second bias transistor is operatively coupled to one of the first output terminal or the second output terminal of the switch circuit and the other one of the gate or the drain of the second bias transistor is operatively coupled to one of the second clock signal or the first clock signal.

13. The level shifter as recited in claim 12, wherein the grounding module comprises a second input transistor module that comprises the second bias transistor and a second input transistor operatively coupled in a structure that mirrors that of the first input transistor module.

14. A display device comprising:
a driver circuit comprising a level shifter as in claim 12;
a control circuit operative coupled to the driver circuit; and
a display element operatively coupled to the control circuit, the control circuit controlling the operation of the display element.

15. An electronic device, comprising:
a display device, as in claim 14; and
a controller operatively coupled to the display device, controlling the operations of the display device to render a display image through the display element in accordance with display data.

16. The electronic device as recited in claim 15, wherein the pixels are switched correspondingly by a plurality of LTPS transistors, wherein the LTPS transistors and the level shifter are formed in an SOG configuration.

* * * * *